US012763135B1

(12) United States Patent
Kanj

(10) Patent No.: US 12,763,135 B1
(45) Date of Patent: Oct. 13, 2026

(54) HARDENED MEMORY DEVICE NOISE PROTECTION

(71) Applicant: Synopsys, Inc., Sunnyvale, CA (US)

(72) Inventor: Rouwaida Kanj, Cedar Park, TX (US)

(73) Assignee: Synopsys, Inc., Sunnyvale, CA (US)

( * ) Notice: Subject to any disclaimer, the term of this patent is extended or adjusted under 35 U.S.C. 154(b) by 91 days.

(21) Appl. No.: 18/757,331

(22) Filed: Jun. 27, 2024

(51) Int. Cl.
*G11C 16/04* (2006.01)
*G11C 11/412* (2006.01)
*G11C 11/417* (2006.01)

(52) U.S. Cl.
CPC .......... *G11C 11/417* (2013.01); *G11C 11/412* (2013.01)

(58) Field of Classification Search
CPC ............................ G11C 11/417; G11C 11/412
See application file for complete search history.

(56) References Cited

U.S. PATENT DOCUMENTS 8,976,588 B2 * 3/2015 Lee .................... G11C 14/0063 365/185.24
9,230,637 B1 * 1/2016 Butt ...................... G11C 11/419
2019/0392892 A1 * 12/2019 Lu ......................... G11C 11/412

* cited by examiner

*Primary Examiner* — Pho M Luu

(57) ABSTRACT

A memory device may include a first cell and a second cell, where the first cell and the second cell are each to store at least a first data bit value. The memory device may further include at least one noise protection device linking the first cell and the second cell that is configured to dissipate at least a portion of noise originating in one of: the first cell or the second cell to another of: the first cell or the second cell.

20 Claims, 7 Drawing Sheets

HARDENED MEMORY DEVICE NOISE PROTECTION

TECHNICAL FIELD

The present disclosure relates to integrated circuit memory devices, and more particularly to memory devices with at least one noise protection device linking first and second cells and configured to dissipate noise originating in one of: the first cell or the second cell to another of: the first cell or the second cell.

BACKGROUND

Memory cells, such as static random access memory (SRAM) cells, may experience single-event upsets (SEUs) or other noises. One aspect of SEUs in integrated circuits is that photocurrent may increase with device width. This renders larger memory cells more susceptible to SEU. In particular, larger devices are typically associated with larger charge accumulation. In other words, the likelihood of a stored data bit value being flipped in response to a noise event, such as an ionizing particle strike, is greater for memory devices based upon larger device sizes as compared to smaller devices sizes in integrated circuit (IC) manufacturing process technologies. Conversely, a high density cell, which has smaller devices, is most robust when considering transients injected in memory cell pull-down transistors, for example. In general, the photocurrent may increase as a function of transistor dimensions (width/length).

BRIEF DESCRIPTION OF THE DRAWINGS

The present disclosure will be understood more fully from the detailed description given below and from the accompanying figures of embodiments of the present disclosure. The figures are used to provide knowledge and understanding of embodiments of the present disclosure and do not limit the scope of the present disclosure to these specific embodiments. Furthermore, the figures are not necessarily drawn to scale.

DETAILED DESCRIPTION

Figure 1:
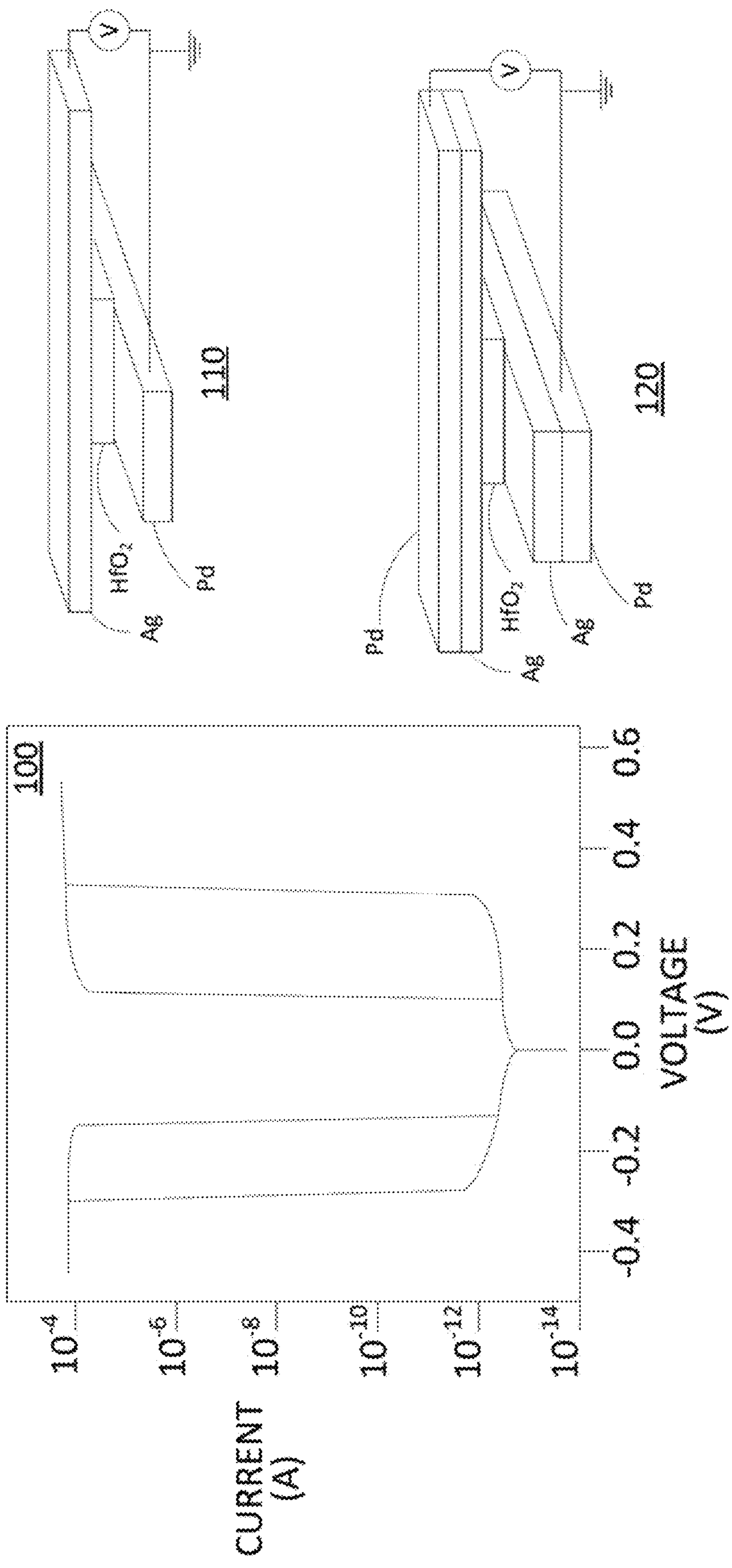
FIG. 1 illustrates example threshold switching devices, e.g., an example asymmetric threshold switching device and an example symmetric bidirectional threshold switching device.

Aspects of the present disclosure relate to memory devices with at least one noise protection device linking first and second cells and configured to dissipate noise originating in one of the first cell or the second cell to another of the first cell or the second cell. For instance, the memory device may have a dual-cell design, e.g., in which each stored data bit has two cells, e.g., a primary cell and a secondary cell, which may also be broadly referred to as a first cell and a second cell, or a first sub-cell and a second sub-cell. In one example, the memory device may be a static random access memory (SRAM) memory device, where the first cell may include a first node to store a first data bit value and a second node to store a second data bit value that is complementary to the first data bit value, and where the second cell may include a third node to store the first data bit value and a fourth node to store the second data bit value. For instance, the first cell may include a first latch, e.g., a pair of first and second inverters cross-coupled in a first feedback loop that includes the first node and the second node. Similarly, the second cell may include a second latch, e.g., a pair of third and fourth inverters cross-coupled in a second feedback loop that includes the third node and the fourth node. In one example, such an SRAM memory device may further include at least a first noise protection device linking the first node and the third node and at least a second noise protection device linking the second node and the fourth node.

In another example, a memory device may comprise a dynamic random access memory (DRAM) memory device in which a first cell may include a first storage capacitor and a first access transistor having a first gate coupled to an address bar, a first source coupled to a bit line, and a first drain coupled to the first storage capacitor via a first node to store a data bit value. A second cell may include a second storage capacitor and a second access transistor having a second gate coupled to the address bar, a second source coupled to the bit line, and a second drain coupled to the second storage capacitor via a second node to store the same data bit value.

In one example, the noise mitigated via the hardened memory devices of the present disclosure may be transient pulses, e.g., a single-event transient or other unintended transient pulses. In addition, although the term single-event transient may be used herein, it should be understood that a single-event transient may be associated with one (or more) ionizing particles, or the like. In other words, the source of the noise is not strictly limited to a single particle source. It should also be noted that a single-event upset (SEU) may comprise an unintended/undesirable result of an unintended transient pulse, e.g., a flip of the stored binary data value at a node of a memory device. As such, examples of the present disclosure describe hardened SRAM and DRAM memory devices that may prevent or substantially reduce the likelihood of a single-event upset.

It is again noted that in one example, the present disclosure includes a dual SRAM cell, e.g., a pair of cells storing the same data bit value(s)) with a pair of noise protection devices connecting the two components of the cell for guarding against SEUs. In one example, the noise protection devices may be bidirectional threshold switching devices (BTSDs), which are described in greater detail below. The bidirectional threshold switching devices may selectively distribute unintended charge among the two cells. This is in contrast to one large cell which, due to a larger drain area with a higher capacitance, may result in increased disturbance susceptibility. In another example, the noise protection devices may be resistors, e.g., memristors, which may replace the BTSDs in the previous example. In another example, the noise protection devices may be diode-connected transistors. In still other examples, a memory device of the present disclosure may include a dual DRAM cell (e.g., a pair of cells storing the same data bit value) with a BTSD linking the pair of cells, a resistor (e.g., a memristor) linking the pair of cells, or one or more diode-connected transistors linking the pair of cells.

Technical advantages of the present disclosure include, but are not limited to enabling a memory device with reduced SEU risk from unintended transient pulses (or other noises), e.g., a reduced risk of cell(s) flipping stored value(s). Examples of the present disclosure also provide an improved integrated circuit, e.g., a memory device implementing various aspects described herein. For instance, a memory device of the present disclosure may provide noise protection with reduced footprint or area, e.g., as compared to a hardened memory device implementing sets of three redundant memory cells with majority voting, or the like. Examples of the present disclosure also provide an improved computing device or system implementing various aspects described herein. For instance, a computing device including a memory cell of the present disclosure may be fabricated in a smaller form factor, e.g., compared to a computing device that may use a memory component with triple redundant memory cells, or the like. In addition, such a computing device may complete operations faster/in fewer clock cycles compared to memory components that do not include aspects of the present disclosure. For example, with fewer instances of memory cell corruption, such a computing device may avoid additional operations to recover one or more affected memory cell values. These and other aspects of the present disclosure are discussed in greater detail below in connection with the examples of FIGS. 1-7.

It is noted that a one-directional switch does not turn on until the voltage across the switch reaches a threshold voltage (VTH). The switch, thus is protected from noise until a voltage equal to VTH builds across the device. The switch turns off when the voltage across the device reaches a hold voltage (VIH), e.g., a low cutoff threshold. A bidirectional threshold switching device behaves like two back-to-back one-directional switches. For instance, bidirectional threshold switching devices may be characterized by a high switching threshold (VTH), a low hold voltage (VIH), and a steep turn-on, in addition to being bidirectional (e.g., exhibiting a VTH and VIH for both positive and negative voltage differentials). An example, bidirectional threshold switching device may be silver and hafnium oxide-based (or variants thereof, e.g., HfOx), which may also be referred to as a silver/hafnia-based selector. For instance, asymmetric and symmetric metal-insulator-metal structures have been demonstrated to exhibit these properties, such as an asymmetric structure of palladium/hafnium oxide/silver layers, or a symmetric structure of palladium/silver/hafnium oxide/sliver/palladium layers. For instance, FIG. 1 illustrates a first example threshold switching device 110 having an asymmetric structure including layers of silver, hafnium oxide, and palladium, and a second example bidirectional threshold switching device 120 having a symmetric structure including layers of palladium, silver, hafnium oxide, silver, and palladium. Such devices may exhibit a steep subthreshold swing as a conductive path forms or disappears based on the voltage across the device in response to powering on or off. The bidirectional switching characteristics may be summarized as in graph 100 of FIG. 1, which illustrates current response to voltages across an example bidirectional threshold switching device. In particular, a positive VTH is shown around 0.3 V and a positive VIH is shown around 0.1 V. Similarly, a negative VTH is shown around −0.3 V and a negative VIH is shown around −0.1 V.

Other bidirectional threshold switching devices may be copper-based or other metal-based, or may use a different ferroelectric oxide or other materials, such as strontium titanate (SrTiO3), zirconium dioxide (ZrO2), and so forth. It should also be noted that examples of the present disclosure may utilize developments of these types of bidirectional threshold switching device to provide a memory cell design with enhanced cell stability. For instance, bidirectional threshold switching devices of the present disclosure may be extended to include voltage controlled switches where the characteristics (VTH and VIH for both positive and negative voltages) may vary, e.g., based on a switch control voltage, or the like. In other words, such a bidirectional threshold switching device may have tunable characteristics/thresholds. Alternatively, or in addition, a bidirectional threshold switching device can be engineered to have a VTH high enough to remain off in response to lesser voltages (e.g., an intended write, which may not exceed a supply voltage (VDD)), but low enough that unintended transient pulses that exceed VDD may cause the BTSD to turn on and allow current/charge to flow between cells in a cell pair (and likewise for transient pulses that have negative voltages that fall below ground (GND) or a negative supply voltage (VSS)). Such a bidirectional threshold switching device may turn on strongly when the voltage potential builds up to exceed VTH (steep switching curve). Conversely, such a bidirectional threshold switching device prevents the flow of current in response to lesser voltages (e.g., read disturb noise or other noises).

Figure 2:
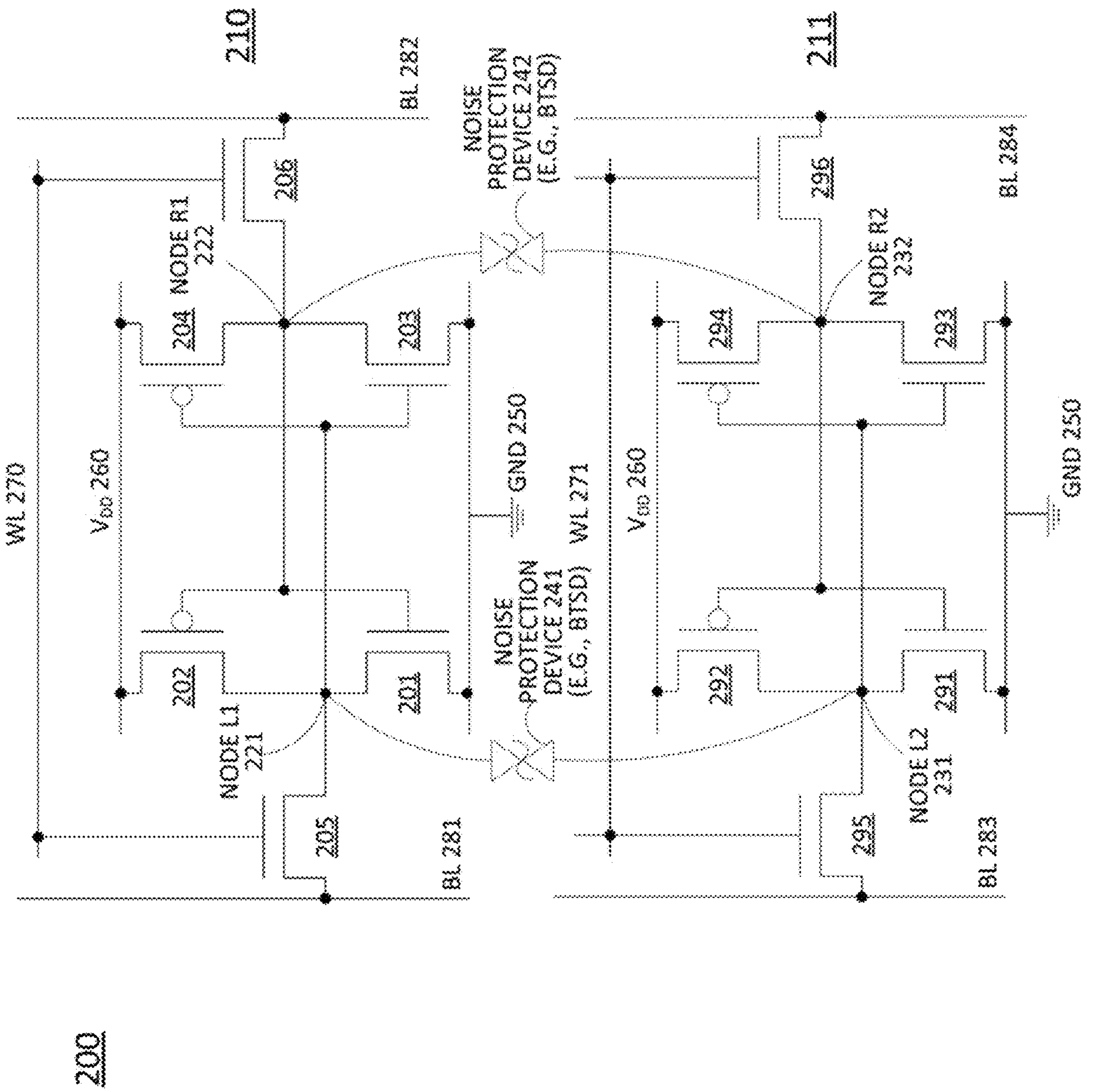
FIG. 2 illustrates a first example hardened static random access memory cell having a dual-cell design with noise protection devices in accordance with the present disclosure.

To further aid in understanding the present disclosure, FIG. 2 illustrates a first example memory cell 200 having a first cell or sub-cell, e.g., a primary cell 210, and a second cell or sub-cell, e.g., a secondary cell 211. The memory cell 200 may be a six transistor (6T) SRAM design in which each of the primary cell 210 and secondary cell 211 have two inverters and two read-write gates (pass-gate transistors for read and write). For instance, in the primary cell 210, n-type transistor 201 and p-type transistor 202 may form a first inverter, while n-type transistor 203 and p-type transistor 204 may form a second inverter. The n-type transistors 205 and 206 may be used for read and write operations via wordline 270 and bitlines 281 and 282. In other words, n-type transistors 205 and 206 may be referred to as read-write gates. The inverters are connected to ground (VSS) 250 and a supply voltage source 260 (VDD) as well as to the n-type transistors 205 and 206. It should be noted that by convention, the memory cell 200 may be set to read node L1 (221) as the stored value, or the node R1 (222) as the stored value. However, since it is understood that these nodes store complementary values, the stored value may be read from either side, or from both sides (e.g., using a sense amplifier that senses positive and negative voltage differentials).

The secondary cell 211 may have a similar configuration of a first inverter (n-type transistor 291 and p-type transistor 292), a second inverter (n-type transistor 293 and p-type transistor 294), and read-write gates (n-type transistors 295 and 296), which may be used for read and write operations via wordline 271, and via bitlines 283 and 284. The inverters are connected to ground (VSS) 250 and supply voltage source 260 (VDD) as well as to the n-type transistors 295 and 296. Node L2 (231) may store the same value(s) as node L1 (221) and node R2 (232) may store the same value(s) as noted R1 (222). Similar to the above, a stored value may be read from either node L2 or node R2, or from both sides (e.g., using a sense amplifier that senses positive and negative voltage differentials).

It should be noted that throughout the present disclosure, a supply voltage VDD may alternatively or additionally be referred to as logic high, a logic high value, or "1." Similarly, a logic low/0 may correspond to ground (GND) and/or a negative supply voltage VSS. It should also be noted that although examples are described herein primarily in connection with complementary metal-oxide-semiconductor (CMOS) circuits including PMOS and NMOS transistors, in other, further, and different examples, other similar transistor types may be used, such as PNP bipolar junction transistors, NPN bipolar junction transistors, tunnel field-effect transistors (TFETs), heterojunction TFETs, fin field-effect transistors (FinFETs), and so forth. It should also be noted that examples of the present disclosure may relate to a six transistor (6T) SRAM cell, as well as variations thereof, such as a multi-port SRAM cell.

Referring to the primary cell 210, to perform a dynamic read operation, the bitlines 281 and 282 may be pre-charged to VDD. For instance, two p-type transistors may be connected/coupled (e.g., electrically connected through traces, vias, etc.) to the bitlines 281 and 282 and to a voltage supply rail. For instance, a pre-charge (PCH) control signal may open the pre-charge gates (e.g., the transistors controlling pre-charging of bitlines 281 and 282). Thus, for example, to pre-charge the bitlines 281 and 282, the control signal (PCH) may be pulled low. In one example, the pre-charge transistors are p-type such that a low control signal (PCH) on the gates may cause these transistors to be open, resulting on the bitlines 281 and 282 being set to VDD, e.g., logic high/1. When the pre-charge transistors are closed by pulling the control signal PCH on the gates high (e.g., logic high/1), the bitlines 281 and 282 may still remain at or close to VDD. Initially, the wordline 270 may be held at VSS, e.g., logic low/0. For the present example, it may be assumed that node L (221) and node R (222) store complementary logic values (e.g., logic low/0 and logic high/1, respectively). To perform a read, the wordline 270 may be turned on (logic high/1), and the pre-charge turned off, e.g., closing the gates of two p-type transistors connecting the bitlines 281 and 282 to the positive supply voltage VDD. At this point, the bitlines 281 and 282 remain charged to at or close to VDD.

On the right side, while the wordline 270 is logic low/0 and therefore transistor 206 is open, node R (222) is logic high/1 and bitline 282 is also logic high/1. Accordingly, little to no current flows via the read/write transistor (pass gate) 206. However, on the left side the transistor 205 is open, bitline 281 is logic high/1, and node L (221) is logic low/0. As such, current may flow via transistor 205 and voltage on bitline 281 should start to drop. If node R (222) remains logic high/1 (which it should), the pull up active low (transistor 202) should be off, and pull down active high (transistor 201) should be on. Thus, transistor 201 may be affected by node L 221 increasing in voltage, which transistor 201 may facilitate discharging back to zero (as the bitline 281 is similarly declining from logic high/1 towards zero/VSS). In other words, the left side, node L (221) is trying to stay logic low/0. In one example, a sense amplifier may sense the voltage dropping on bitline 281 (versus bitline 282 remaining at logic high/1). The read operation may terminate in a sufficiently short duration such that the voltage on node L1 (221) does not reach some intermediate value, and such that the right inverter (transistors 203 and 204) do not turn on.

Referring again to the primary cell 210, to perform a write operation, it may be preferable that the pass-gate transistors (e.g., transistors 205 and 206) are strong, while the pull-up transistors (e.g., transistors 202 and 204) are configured to assist the pass gates (e.g., transistors 205 and 206) on the writing. For illustrative purposes it may again be assumed that node L1 (221) is logic low/0 and node R1 (222) is logic high/1. To prepare data for writing (e.g., where the value to be set for node L1 (221) is logic high/1 and the value to be set for node R1 (222) is therefore low/0), bitline 281 may be set to logic high/1 and bitline 282 may be set to logic low/0. It should be noted that it may be possible to drive from only one side, but the write speed may be faster and the likelihood of success of the write operation may be higher when driven from both sides. After setting the bitlines 281 and 282, the wordline 270 may be turned on (e.g., logic high/1). In such case, the voltage at node L1 (221) may start to rise/increase to logic high/1. Likewise, node R1 (222) may start to decrease in voltage towards logic low/0 and discharge through the pass gate, transistor 206. The transistors in the inverters (e.g., transistors 201, 202, 203, and 204 may also turn on and help drive the flip in values of node L1 (221) and node R1 (222), respectively. However, if the transistors 205 and 206 are weak, or if the pull-up transistor 204 is too weak in this example, the write operation may fail to bring the memory cell 200 node R1 (222) to logic high/1 in time before the signal on the write line 270 goes back to logic low/0.

In one example, write operations to primary cell 210 may be repeated for secondary cell 211, e.g., via bitlines 283 and 284, and wordline 271. For instance, the same values may be placed on the bitlines 283 and 284 as bitlines 281 and 282, respectively. In one example, bitline 283 may be the same as bitline 281 and bitline 284 may be the same as bitline 282. Thus, two bitlines may be pre-charged to the appropriate voltages instead of four (and in one example, similarly for wordline 270 and wordline 271). For a read operation, in one example, the primary cell 210 may be used alone. However, in another example, both the primary cell 210 and the secondary cell 211 may be activated and may cause a voltage change on one of bitlines 281 or 283, and on one of bitlines 282 or 284, respectively (or on a shared bitline, where 281 and 283 may be the same, and where 282 and 284 may be the same).

As further illustrated in FIG. 2, the memory cell 200 may include a first noise protection device 241 linking node L1 (221) and node L2 (231), and a second noise protection device 242 linking node R1 (222) and node R2 (232). As noted above, in one example, noise protection devices 241 and 242 may each comprise a bidirectional threshold switching device (BTSD). However, in other examples, noise protection devices 241 and 242 may each comprise one or more resistors (e.g., including memristors), or one or more diode-connected transistors.

In any case, the left storage node of the upper/primary cell 210, node L1 (221), is connected to the left storage node of the lower/secondary cell 211, node L2 (231), via noise protection device 241, e.g., a first BTSD. Similarly, the right storage node of the upper/primary cell 210, node R1 (222), is connected to the right storage node of the lower/secondary cell 211, node R2 (232), via noise protection device 242, e.g., a second BTSD. The primary cell 210 and secondary cell 211 store the same value(s) and can be written simultaneously as one unit via their separate pass gates. The primary cell 210 can be dedicated for read operations. The secondary cell 211 may provide a backup SRAM cell/subcell that together with the noise protection devices 241 and

242 helps harden the primary cell 210 to radiation, and hence to single event upsets and/or other noises, such as electrostatic discharge (ESD), etc. In addition, the upper/primary cell 210 may act as a guard for the lower/secondary cell 211 if radiation hits either of the storage nodes, nodes L2 (231) or R2 (232) of the secondary cell 211. For example, when radiation results in a glitch on the storage node of one of the cells, a voltage difference builds across the respective noise protection device 241 or 242, e.g., a BTSD. When the voltage difference exceeds the BTSD VTH, the BTSD may activate/turn on, directing part of the charge, or current from the node upset from the primary cell 210 to the secondary cell 211 (or vice versa), which in turn acts alongside pull-up or pull-down transistors of the inverters (e.g., transistors 201-204 or transistors 291-294) to prevent the node upset from causing a voltage to reach an intermediate value, and hence for a stored data bit value to change at one or more of the nodes.

To further illustrate, in one example, the left storage nodes, node L1 (221) and node L2 (231) may store data bit values of 0/logic low (e.g., VSS). Consequently, the right storage nodes, node R1 (222) and node R2 (232) may store data bit values of 1/logic high (e.g., VDD). In this case, node L1 (221) and node L2 (231) store same value, e.g., 0/logic low, so the voltage across the noise protection device 241, e.g., a BTSD, should be zero. In an illustrative example, if node L1 (221) is affected by a transient pulse, e.g., a radiation event or other noise events, a voltage differential may build across the noise protection device 241, e.g., a BTSD, which should activate/turned on when VTH is reached (e.g., where VDD is 1 V, VTH may be 0.4 V or 0.45 V, etc.). To further illustrate, an upset can occur over the drain of the sensitive transistor in a SRAM cell (e.g., the off-state transistor, which may be the pull-down transistor when the node (inverter output) is charged with a logic high/1 or the pull-up transistor when the node (inverter output) is discharged with a logic low/0). In the latter example, a radiation strike may thus cause current through pull-up transistor 202 from supply voltage source 260 (VDD) to node L1 (221), which may cause node L1 (221) to rise from logic low/0 towards logic high/1. In other words, it is possible that node L1 (221) may flip the stored logic value. It should be noted that the pull-down transistor 201 may discharge some, but assuming that the pulse exceeds the strength of the pull-down transistor 201 and the cell cannot recover, the noise protection device 241, e.g., a BTSD, may activate/turn on and allow current to flow from node L1 (221) to node L2 (231). The pull-down transistor 291 may then also help to discharge the disturbance of the unintended transient pulse. Thus, the disturbance is distributed over the primary cell 210 and the secondary cell 211 e.g., such that the inverter threshold voltage(s) are not reached and such that the pull-down transistors 201 and 291 may stabilize the respective nodes L1 (221) and L2 (231) helping avoid cell flip.

In another example, if node L2 (231) is affected by an unintended transient pulse (e.g., through a radiation strike at pull-up transistor 292), a voltage differential may build across the noise protection device 241, e.g., a BTSD, which should activate/turn on when the switch VTH is reached. In one example, the voltage differential may be opposite to the above, and hence could be a negative voltage potential. In such case, the BTSD may activate/turn on when a negative VTH is reached. In one example, a positive VTH and negative VTH of the BTSDs of noise protection devices 241 and 242 may be symmetric (e.g., of the same absolute value, such as 0.3 V and −0.3 V, or the like). In both examples, pull-down transistors 201 and 291 both work in tandem to discharge the disturbance. A similar function is provided by the memory cell 200 with respect to unintended transient pulses/disturbances that may affect a node storing a logic high/1 data bit value. For instance, if node R1 (222) storing logic high/1 is hit with an unintended transient pulse (e.g., from ionized particle strike, radiation, etc.), the voltage may drop lower (e.g., from VDD toward ground (GND)/VSS, e.g., 0 V). For example, as noted above, an upset can occur over the drain of the sensitive transistor in a SRAM cell (e.g., the off-state transistor, which may be the pull-down transistor when the node (inverter output) is charged with a logic high/1). In this example, a radiation strike may thus cause current through pull-down transistor 203, which may cause node R1 (222) to drop from logic high/1 towards logic low/0. However, in such case, the voltage across the BTSD of noise protection device 242 may exceed a negative VTH, causing the BTSD to activate/turn on. When the BTSD is activated, current may then flow from node R2 (232) to node R1 (222). It should be noted that the voltage at node R2 (232) may also begin to drop as a consequence. However, for a wide range of voltage drops that may be caused by unintended transient pulses, the memory cell 200 may prevent flipping of stored data bit values by spreading charge, or current across the primary cell 210 and secondary cell 211, e.g., such that the inverter threshold voltage(s) are not reached and such that the pull-down transistor 201 is not turned off and the pull-up transistors 204 and 294 may stabilize the respective nodes R1 (222) and R2 (232) instead of the cell flipping. The same or similar function may be provided if the node R2 (232) is hit with an unintended transient pulse. More generally, whichever of the four storage nodes is hit, current may flow to or from the hit node when one of the BTSDs is turned on, depending on the data bit value that is stored. Hence, the second or first cell assists in fighting or dissipating the noise or charge on the left or right nodes, providing a backup low or high corrective path mirroring the other cell's stored value.

It should be noted that the example memory cell 200 is provided for illustrative purposes and that other, further, and different examples of the present disclosure may provide a different memory cell design. For instance, in another example, memory cell 200 may include a single BTSD or other noise protection devices. For instance, noise protection may be provided for the left storage nodes or right storage nodes. In one example, the memory cell 200 may be extended to be a multi-port memory cell design, e.g., where each of the primary cell 210 and the secondary cell 211 may include a write port and a read/write port (e.g., with additional access transistors/pass gates). In addition, it should again be noted that although the foregoing is described and illustrated primarily in connection with noise protection devices 241 and 242 being BTSDs, in other examples, noise protection devices 241 and 242 may each include one or more resistors (including memristors) or one or more diode-connected transistors. Thus, these and other modifications are all contemplated within the scope of the present disclosure. Additional examples are illustrated in connection with FIG. 3 and described in greater detail below. In addition, it should be noted that although terms such as left, right, top, bottom, etc. are used in connection with various components of various examples of the present disclosure, such terms are only used for illustrative purposes corresponding to how such components may appear in the figures. However, in other examples, the orientations, relative positions, and so forth may be different. Thus, left and right may be similarly referred to as "first" and "second," for example, and similarly for top and bottom, and so forth.

An evaluation of the circuit design using a predictive tech model (PTM) demonstrates the effectiveness of an example memory cell, e.g., of a design such as memory cell 200 of FIG. 2, as compared to a similar memory cell without protective BTSDs. For instance, in one example associated with a 45 nm PTM, the threshold voltage VT for static random access memory (SRAM) transistors may be set to 0.35 V, while VDD may be set to 0.7 V. The pull-up transistors (PUTs) of the inverters may be minimally sized at 60 nm, the pass-gates (PGs) may be set to 90 nm, and the pull-down (PD) transistors may be set to 110 nm, e.g., for a 45 nm technology. $G_{on}$ and $G_{off}$ may be 1e-3 and 1e-12, respectively. In addition, a 2 fF capacitance at the internal nodes may be assumed. For modeling a transient pulse, such as a radiation strike, the charge injection current may by represented by a double exponential model as illustrated in equation (1) below. Equation (2) lists the corresponding injected charge.

$$I(t) = \begin{cases} 0; & t < t_{d1} \\ I_{Peak}\left(1 - e^{\frac{-(t-t_{d1})}{\tau_1}}\right); & t_{d1} < t < t_{d2} \\ I_{Peak}\left(e^{\frac{-(t-t_{d2})}{\tau_2}} - e^{\frac{-(t-t_{d1})}{\tau_1}}\right); & t > t_{d2} \end{cases} \quad (1)$$

$$Q_{Total} = I_{Peak}\left[\tau_1 + \tau_2 + (t_{d2} - t_{d1}) - \tau_1 e^{\frac{-(t_{d2}-t_{d1})}{\tau_1}}\right] \quad (2)$$

The parametrized current waveform variables in SPICE may be $\tau_1$, $\tau_2$, $td_1$, $td_2$, and $I_{peak}$.

To assess the effectiveness of an example memory cell, such as memory cell 200 of FIG. 2, it may be assumed that the left nodes, node L1 (221) and node L2 (231), store a logic low/0, and thus nodes R1 (222) and R2 (232) store a logic high/1 (e.g., at or near 0.7 V/VDD in the present example), where node R1 (222) may be hit with an unintended transient pulse. Sweeping the peak current, it may be observed that a memory cell such as memory cell 200 having the above parameters may fail when $I_{peak}$ is at 75 uA, whereas as a standalone 6T SRAM cell may fails when $I_{peak}$ is at 50 uA.

To further illustrate, Table 1 presents the summary results for $I_{peak}$ tolerance for a hardened SRAM cell, such as memory cell 200, for different switch time constants (Tau in the 1st column of Table 1) when the radiation affects a storage node storing a logic high/1 or a logic low/0. Depending if the transient pulse affects a storage node with a logic low/0 or logic high/1 data bit value, an n-type transistor or a p-type transistor may trigger an SEU, and hence the tolerance for the injected charge peak current may vary because of the differing device characteristics. It should be noted that the results of Table 1 may be swapped if the right nodes store a logic low/0 and the left nodes store logic high/1.

TABLE 1

| Ipeak Crit (uA) | | |
|---|---|---|
| | Upset | |
| Tau (s) | R@1 | L@0 |
| 1e–11 | 85 | 140 |
| 5e–11 | 80 | 125 |
| 1e–10 | 80 | 115 |
| 5e–10 | 75 | 110 |
| 1e–9 | 70 | 105 |
| Regular SRAM | 50 | 105 |

It can be seen in Table 1 that the node storing a logic high/1 is more limiting if it is hit with a transient pulse because it can tolerate a peak current of 70 uA, whereas a node storing a logic low/0 can tolerate up to 105 uA. This depends on the restoring transistors being the smaller pull-up or the larger pull-down devices.

Figure 3:
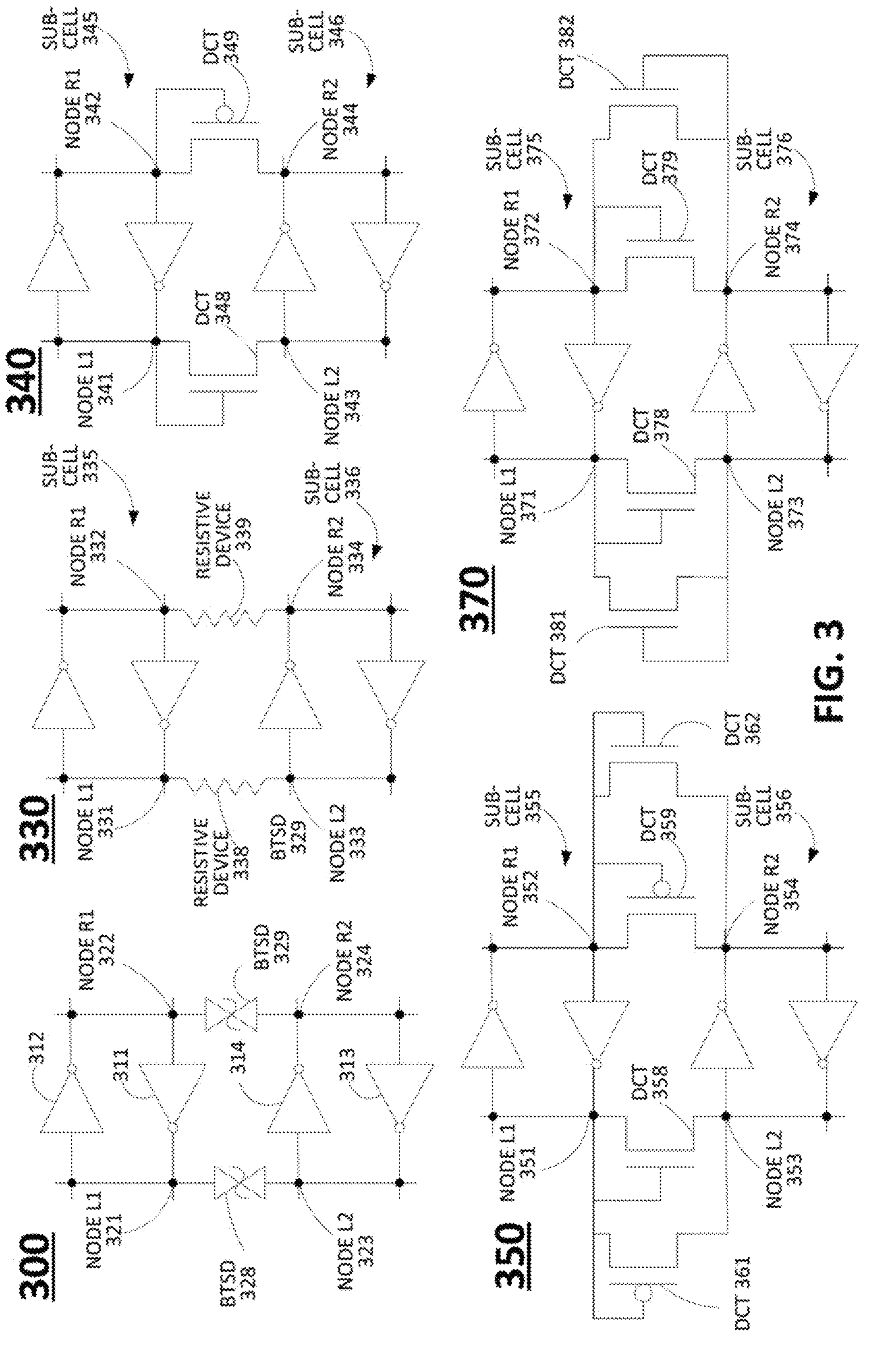
FIG. 3 illustrates additional examples of hardened static random access memory cells having a dual-cell design with noise protection devices in accordance with the present disclosure.

FIG. 3 illustrates a first example memory cell 300, which may provide a different representation of the same or similar memory cell as memory cell 200 of FIG. 2. For instance, inverter 311 may include transistors 201 and 202 of memory cell 200 of FIG. 2, inverter 312 may include transistors 203 and 204 of memory cell 200, inverter 313 may include transistors 291 and 292 of memory cell 200, and inverter 314 may include transistors 293 and 294 of memory cell 200. BTSDs 328 and 329 may correspond to the noise protection devices 241 and 242 of FIG. 2, e.g., also representing BTSDs. Likewise nodes L1 (321), R1 (322), L2 (323), and R2 (324) of memory cell 300 of FIG. 3 may correspond to nodes L1 (221), R1 (222), L2 (231) and R2 (232), respectively, of memory cell 200 of FIG. 2. As discussed above, the BTSDs 328 and 329 may enable noise originating in one sub-cell to be also combatted by a second sub-cell if the noise exceeds VTH of the respective BTSD 328 or BTSD 329.

FIG. 3 further illustrates an additional example memory cell 330 in which a resistive device is used for noise protection and to join the storage nodes of the cells in a dual SRAM design. For instance, storage node L1 (331) of sub-cell 335 and node L2 (333) of sub-cell 336 may be linked via resistive device 338. Similarly, node R1 (332) of sub-cell 335 and node R2 (334) sub-cell 336 may be linked via resistive device 339. The resistive devices 338 and 339 may each comprise one or more resistors, or the like. In one example, the resistors may be memristors, which may further be inherently hardened and additionally tolerant to radiation.

In one example, if the resistive devices 338 and 339 are nonvolatile, they can be hidden in the upper layers of an integrated circuit design and hence may have minimal or no impact on the footprint (and similarly for BTSDs in the previous example(s)). Unlike BTSDs, resistors do not have a switching threshold delay (e.g., a time for voltage to build at a node in response to a transient pulse before reaching VTH of a BTSD). Thus, memory cell 330 may function to distribute a disturbance over both sub-cells at the onset of the disturbance. Table 2 provides summary results for Ipeak tolerance for a hardened dual SRAM cell with resistor-based noise protection, such as memory cell 330, for different resistance values when a transient pulse affects a storage node storing a logic high/1 or a logic low/0. For purposes of comparison, Ipeak tolerance for a reference SRAM cell (e.g., a 6T SRAM cell without noise protection in accordance with the present disclosure) is also shown in Table 2.

| Ipeak Crit (uA) | | |
| --- | --- | --- |
| | Upset | |
| Resistance | R@1 | L@0 |
| 1K | 100 | 200 |
| 5K | 95 | 170 |
| 10K | 90 | 150 |
| 20K | 80 | 125 |
| 100K | 55 | 105 |
| Regular SRAM | 50 | 105 |

FIG. 3 further illustrates an additional example memory cell 340 in which diode-connected transistors (DCTs) 348 and 349 are used as the noise protection devices joining the sub-cells 345 and 346. In particular, DCT 348 (e.g., an n-type transistor) links node L1 (341) and node L2 (342), while DCT 349 (e.g., a p-type transistor) links node R1 (342) and node R2 (344). In an illustrative example, it may be assumed that node L1 (341) and node L2 (343) store logic low/0 data bit values. Consequently, node R1 (342) and node R2 (344) store logic high/1 data bit values. A transient pulse striking node L1 (341) may cause the voltage to spike to near VDD or even above such voltage. In this case, DCT 348 may activate/turn on when the voltage at node L1 (341) exceeds the transistor threshold voltage VT. As in the preceding examples, pull-down transistors in the respective lower inverters may help to dissipate the disturbance. In addition, the distribution between sub-cells 345 and 346 reduces the likelihood that either of the inverter loops is activated and that stored data bit values are flipped.

In one example, the n-type transistor DCT 348 may be sufficient. However, to guard against the possibility that node R1 (342) may become distorted due to feedback from the inverters of sub-cell 345 turning on, a diode-connected p-type transistor, DCT 349, may be included in the example memory cell 340. To illustrate, node R1 (342) may initially store a logic high/1 data bit value, while node L1 (341) stores a logic low/0 data bit value. If a transient pulse strikes node L1 (341) initially sufficient to activate the upper inverter of sub-cell 345, then the voltage at node R1 (342) may drop from logic high/1 (e.g., VDD) toward zero. On the other hand, the p-type transistor, DCT 349, may activate/turn on. Current may flow from node R2 (344) to node R1 (342), to cause R1 (342) to charge back to logic high/1, e.g., VDD. By helping to raise the voltage of node R1 (342) back toward VDD, this may also help to prevent additional feedback in the loop back toward node L1 (341) by remaining below the threshold voltage of the lower inverter of sub-cell 345.

Furthermore, it may be unknown which nodes are intended to be storing logic high/1 or logic low/0, or which node will be hit on which sub-cell. FIG. 3 illustrates an additional example memory cell 350 using multiple diode connected transistors, e.g., in a symmetric "NPNP" bridge. This configuration parallels the NP pair discussed above insofar as it also supports a strike at node R1 (342) at logic low/0 using the N-type transistor. For instance, memory cell 350 may have similar components to memory cell 340, such as sub-cells 355 and sub-cell 356, node L1 (351), node R1 (352), node L2 (353), node R2 (354), and DCTs 358 and 359. In addition, memory cell 350 may include an additional p-type diode-connected transistor, DCT 361, and an additional n-type transistor, DCT 362. In this configuration, the NPNP bridge can also guard the lower cell as well. For instance, the p-type diode-connected transistor, DCT 361, can assist during a hit at node L2 (353) when the node is storing a data bit value of logic low/0. The n-type diode-connected transistor on the opposite side, DCT 362, may also assist if the node voltage drops due to feedback in the lower sub-cell 356.

It is noted that a p-type transistor, e.g., PMOS, may be weak on passing logic low/0, and similarly an NMOS may be weak on passing a logic high/1. In one example, the present disclosure may extend the design of memory cell 350 to an eight transistor bridge (8T bridge). For instance, linking node L1 (351) and node L2 (353) may be DCT 358 and DCT 361 as shown. However, the memory cell may further include an additional n-type diode-connected transistor with the diode connection to node L2 (353), and an additional p-type diode-connected transistor, also with the diode connection to node L2 (353). Similarly, linking node R1 (352) and node R2 (354) may be DCT 359 and DCT 362 as shown. In addition, the memory cell may further include an additional n-type diode-connected transistor with the diode connection to node R2 (354), and an additional p-type diode-connected transistor, also with the diode connection to node R2 (354).

In another example, an n-type only "4N bridge" (e.g., two n-type diode-connected transistors linking left storage nodes and two n-type diode-connected transistors linking right storage nodes) may be provided. For instance, memory cell 370 may have similar components to memory cell 340, such as sub-cells 375 and 376, node L1 (371), node R1 (372), node L2 (373), node R2 (374), and DCTs 378 and 379. In addition, memory cell 370 may include an additional n-type diode-connected transistors, DCTs 381 and 382. However, it should be noted that DCT 381 may have an opposite installation to DCT 378. In particular, it may have a gate and drain (diode-connected end) anchored on node L2 (373), while DCT 378 may have a gate and drain anchored on node L1 (371). A similar configuration is shown on the right side with respect to DCTs 379 and 382 linking node R1 (372) and node R2 (374). Notably, this configuration also provides for protection from a transient pulse hitting any storage node storing any data bit value. In still another example, an p-type only "4N bridge" (e.g., two p-type diode-connected transistors linking left storage nodes and two p-type diode-connected transistors linking right storage nodes) may be provided. This configuration may similarly provide for protection from a transient pulse hitting any storage node storing any data bit value. Thus, these and other modifications are all contemplated within the scope of the present disclosure.

Table 3 provides summary results for Ipeak tolerance for several types of hardened dual SRAM cells with diode-connected transistor-based noise protection, e.g., when a transient pulse affects a storage node storing a logic high/1 or a logic low/0. In these examples, the bridge transistor size(s) for n-type transistors may be twice that of the cell pull-down transistors in the respective inverters. Likewise, the bridge transistor size(s) for p-type transistors may be twice that of the cell pull-up devices in the respective inverters. Other assumptions may be as stated in the example(s) above. For purposes of comparison, Ipeak tolerance for a reference SRAM cell (e.g., a 6T SRAM cell without noise protection in accordance with the present disclosure) is repeated in Table 3.

| Ipeak Crit (uA) | | | | |
|---|---|---|---|---|
| Bridge | Upper hit R@1 | Lower hit R@1 | Upper hit L@0 | Lower hit L@0 |
| 8T | 80 | 80 | 120 | 120 |
| NPNP (upper) | 90 | 65 | 115 | 105 |
| 4N | 75 | 75 | 115 | 115 |
| 4P | 60 | 60 | 110 | 110 |
| | R@1 | | L@0 | |
| Regular SRAM | 50 | | 105 | |

With reference to Table 3, it is noted that the example memory cell with 4N diode-connected transistor noise protection may improve the noise tolerance for a transient pulse at node R1 (e.g., node R1 (372) of the example memory cell 370) by 50 percent. It is also noted that the critical Ipeak improves with device size for the bridge transistors. In one example, a choice of noise protection design may be selected based upon the process technology, the relative strength between the N and P devices, and other factors.

Figure 4:
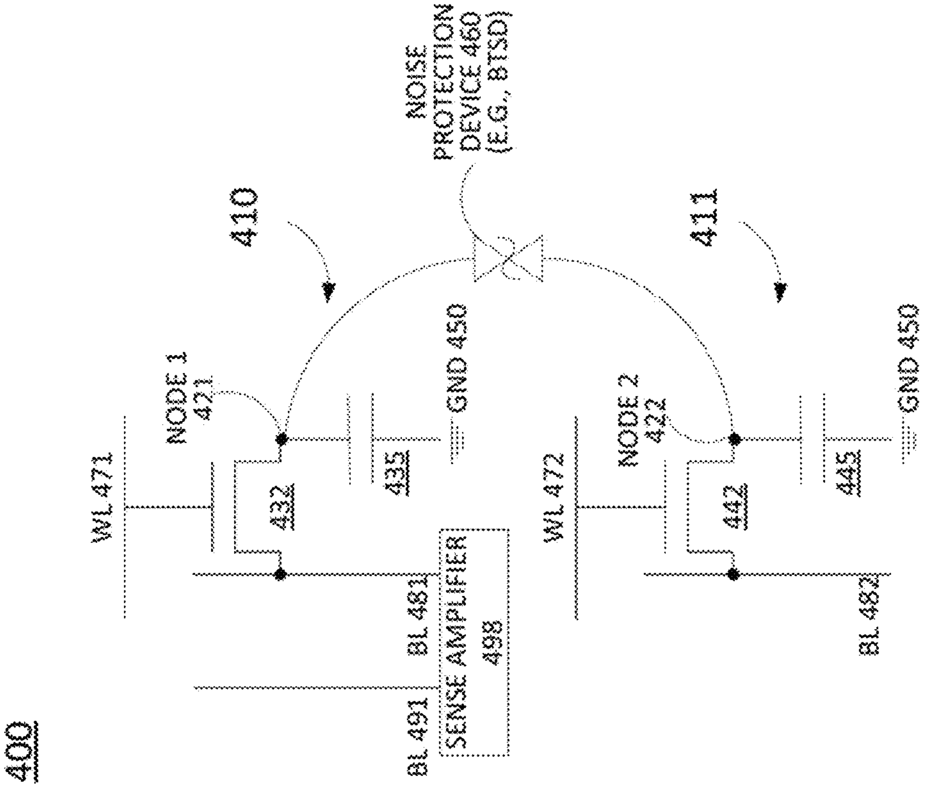
FIG. 4 illustrates an example hardened dynamic random access memory cell having a dual-cell design with one or more noise protection devices in accordance with the present disclosure.

The foregoing is described in connection with example SRAM cells. However, as noted above, the present disclosure also includes hardened DRAM cells with noise protection using bidirectional threshold switching devices (BTSDs), resistors, and/or diode-connected transistors. In this regard, FIG. 4 illustrates an example memory cell 400, e.g., a hardened DRAM cell with a dual-cell design. For instance, memory cell 400 may include a first cell, or sub-cell 410, and a second cell, or sub-cell 411. In one example, sub-cell 410 may be a primary sub-cell, and sub-cell 411 may be a secondary sub-cell. As illustrated in FIG. 4, sub-cell 410 may include a transistor 432, e.g., an n-type transistor and a capacitor 435. A gate of the transistor 432 may be coupled to and controlled by wordline (WL) 471, e.g., an address line or address bar. A source of the transistor 432 may be coupled to bitline (BL) 481. A drain of the transistor 432 may be coupled to the capacitor 435 at node 1 (421), e.g., an upper storage node. On one side, the capacitor 435 may be coupled to the drain of the transistor 432 at node 1 (421). On the other side, capacitor 435 may be coupled to ground 450, e.g., VSS. Sub-cell 411 may have a similar configuration including a transistor 442, e.g., an n-type transistor, and a capacitor 445. A gate of the transistor 442 may be coupled to and controlled by wordline (WL) 472. A source of the transistor 442 may be coupled to bitline (BL) 482. A drain of the transistor 442 may be coupled to the capacitor 445 at node 2 (422), e.g., a lower storage node. On one side, the capacitor 445 may be coupled to the drain of the transistor 442 at node 2 (422). On the other side, capacitor 445 may be coupled to ground 450, e.g., VSS.

With reference to sub-cell 410, in one example, a read operation may include pre-charging bitlines 481 and 491 to an intermediate voltage between VDD and VSS (e.g., 0.5 V if VDD is 1 V and VSS is 0 V). In one example, bitline 491 may be referred to as $\overline{BL}$,, or bitline bar. The pre-charging may be via pre-charge transistors (not shown) in a similar manner as described above in connection with the SRAM example(s) of FIG. 2. The pre-charge transistors may be turned off and writeline 471 may be driven to VDD to activate/turn-on transistor 432. This may allow current to flow from node 1 (421) to bitline 481, or from bitline 481 to node 1 (421) depending upon the data bit value stored at node 1 (421). For instance, if node 1 (421) stores a logic high/1, current may flow from node 1 (421) to bitline 481. The voltage of bitline 481 may increase from the intermediate voltage toward VDD, while the voltage of node 1 (421) may begin to drop from VDD. However, if node 1 (421) stores a logic low/0, current may flow from bitline 481 to node 1 (421). The voltage of bitline 481 may drop from the intermediate voltage toward VSS, while the voltage of node 1 (421) may begin to increase from VSS. The sense amplifier 498 may determine a voltage differential (positive or negative) between BL 481 and BL 491, where the polarity may indicate the stored value at node 1 (421). In the time to complete the read operation, the voltage change at node 1 (421) is intended to be sufficiently small such that the node 1 (421) will still remain at the stored data logic value.

To perform a write operation, bitline 481 may be held at logic high/1, e.g., VDD, or to logic low/0, e.g., VSS, depending upon the data bit value to write to node 1 (421). The wordline 471 may be driven high to activate/turn on the transistor 432. As such, current may flow between bitline 481 and node 1 (421) via the transistor 432. For instance, if node 1 (421) is storing logic low/0 and a logic high/1 is to be written to node 1 (421) as a new value, the logic high voltage on bitline 481 may thus charge node 1 (421) to logic high/1, e.g., VDD. It should be noted that if node 1 (421) is already storing logic high/1 as the previous value, little to no current may flow via transistor 432 if the voltage potential across the transistor 432 is low. Nevertheless, node 1 (421) may continue to maintain the proper logic high/1 value after the write operation. If node 1 (421) stores a logic high/1 and a new value to be written is logic low/0, bitline 481 being held at logic low/0, e.g., VSS may cause current to flow from node 1 (421) to BL 481 and to discharge capacitor 435, resulting in node 1 (421) reaching logic low/0, e.g., VSS. It is noted that if node 1 (421) stores a logic low/0 and a new value to be written to node 1 (421) is also logic low/0, there may be little to no current flow via transistor 432 when the voltage potential across the transistor 432 is at or close to zero (both bitline 481 and node 1 (421) may be logic low/0, e.g., VSS). Nevertheless, node 1 (421) may continue to maintain the proper logic low/0 value after the write operation.

In one example, write operations to sub-cell 410, e.g., a primary cell, may be repeated for sub-cell 411, e.g., a secondary cell, via bitline 482 and wordline 472. For instance, the same values may be placed on the bitline 482 as bitline 481. In one example, bitline 482 may be the same as bitline 481. Thus, one bitline may be pre-charged to the appropriate voltage instead of two (and in one example, similarly for wordline 471 and wordline 472). For a read operation, in one example, the primary sub-cell 410 may be used alone. However, in another example, both the primary sub-cell 410 and the secondary sub-cell 411 may be activated and may cause voltage changes on the bitlines 481 and 482 (or on a shared bitline). It should be noted that for ease of illustration, a second bitline complementary to bitline 482 and an additional sense amplifier are omitted from FIG. 4.

As also shown in FIG. 4, the memory cell 400 may include a noise protection device 460 linking node 1 (421) and node 2 (422). As in the preceding example(s), the noise protection device 460 may be a bidirectional threshold switching device (BTSD). However, in other examples, the noise protection device 460 may include one or more resistors (e.g., including memristors), or one or more diode-connected transistors. In each case, the noise protection device 460 may protect from transient pulses or other noises in the same or similar manner as described above in connection with example SRAM cells. To further illustrate, for a transient pulse with a peak current of 2 uA, it may be observed that a standalone DRAM cell without noise protection of the present disclosure and storing a logic low/0 may see a node voltage jump from 0 V to 0.9 V or more, e.g., where VDD is 1 V. In contrast, a hardened DRAM cell with a dual-cell design, such as memory cell 400 of FIG. 4, may see a rise to 0.5 V or less for both nodes, e.g., node 1 (421) and node 2 (422). Similar performance may be obtained in example in which the noise protection device 460 may include one or more resistors or one or more diode-connected transistors.

Figure 5:
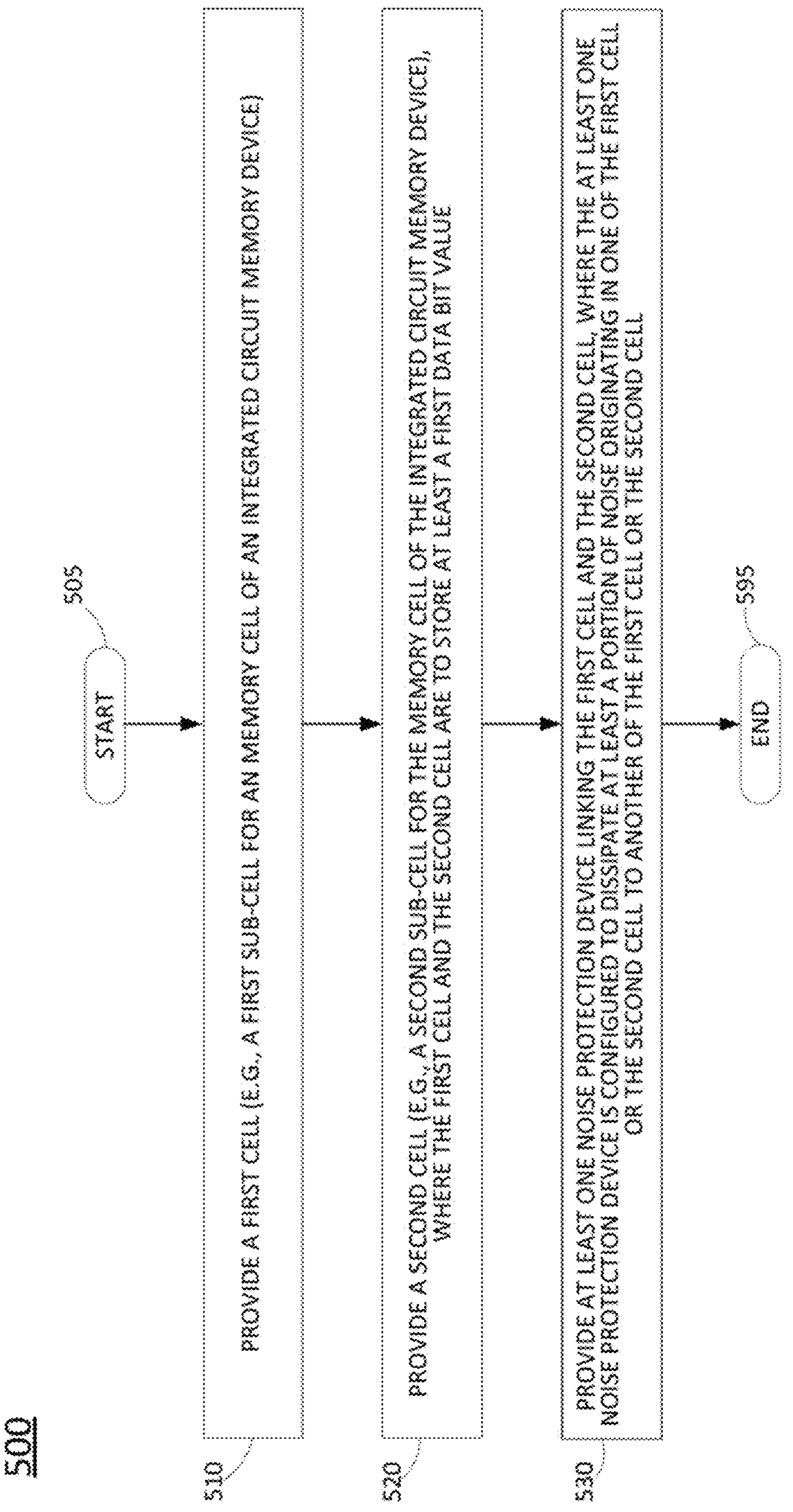
FIG. 5 illustrates a flowchart of an example method for providing a hardened memory cell, e.g., having a dual-cell design with noise protection device(s) in accordance with the present disclosure.

FIG. 5 illustrates a flowchart of an example method 500 for providing a hardened memory cell, e.g., having a dual-cell design with noise protection device(s) in accordance with the present disclosure. In one example, the method 500, or at least a portion thereof, may be performed by and/or under the guidance or instruction of a computing device or system, e.g., a processing system, or processing device, including at least one processor, a memory storing instructions, which when executed by the at least one processor, cause the processing system to perform operations, etc. For instance, the method 500 may be performed by a processing system including at least one processor, such as the computer system 700 of FIG. 7, and/or any one or more components thereof, such as processing device 702, or multiple instances of computer system 700 in communication over one or more networks and operating collectively to perform one or more aspects of the method 500. For instance, in one example, one or multiple instances of the computer system 700 may provide automated control of and/or may include lithography equipment, chemical vapor deposition (CVD) equipment, plasma etching equipment, ion-implantation equipment, robotics and assembly line equipment, and so forth. For illustrative purposes, the method 500 is described in connection with an example performed by a processing system. The method 500 begins in 505 and may proceed to 510.

At 510, the processing system may provide a first cell. For instance, 510 may include design layout and physical placement for an IC design including a memory device or memory cell that includes the first cell. Alternatively, or in addition, 510 may include fabrication of at least the first cell, e.g., on an IC wafer, die, or the like. For instance, 510 may include providing a wafer, deposition of metal, insulator, and/or semiconductor materials for forming components, traces, vias, etc., masking, patterning, and/or removal of materials via etch, chemical mechanical planarization (CMP), or the like, doping, material growth, e.g., epitaxy, and so forth. In one example, the first cell may comprise an SRAM cell, or sub-cell, such as primary cell 210 of memory cell 200 of FIG. 2, sub-cell 335 of memory cell 330 of FIG. 3, sub-cell 345 of memory cell 340 of FIG. 3, etc. In another example, the first cell may comprise a DRAM cell, or sub-cell, such as sub-cell 410 of memory cell 400 of FIG. 4.

At 520, the processing system may provide a second cell, where the first cell and the second cell are each to store at least a first data bit value. For instance, 520 may include design layout and physical placement for an IC design including the memory device or the memory cell that includes the second cell. Alternatively, or in addition, 520 may include fabrication of at least the second cell e.g., on an IC wafer, die, or the like. For instance, 520 may include providing the wafer, deposition of metal, insulator, and/or semiconductor materials for forming components, traces, vias, etc., masking, patterning, and/or removal of materials via etch, CMP, or the like, doping, material growth, e.g., epitaxy, and so forth. In one example, the second cell may comprise an SRAM cell, or sub-cell, such as secondary cell 211 of memory cell 200 of FIG. 2, sub-cell 336 of memory cell 330 of FIG. 3, sub-cell 346 of memory cell 340 of FIG. 3, etc. Thus, for example, the first cell may be provided to include a first node to store the first data bit value and a second node to store a second data bit value that is complementary to the first data bit value, while the second cell may be provided to include a third node to store the first data bit value and a fourth node to store the second data bit value.

In another example, the second cell may comprise a DRAM cell, or sub-cell, such as sub-cell 411 of memory cell 400 of FIG. 4. Thus, for example, the first cell may be provided to include a first storage capacitor and a first access transistor having a first gate coupled to an address bar, a first source coupled to a bit line, and a first drain coupled to the first storage capacitor via a first node to store a first data bit value, while the second cell may be provided to include a second storage capacitor and a second access transistor having a second gate coupled to the address bar, a second source coupled to the bit line, and a second drain coupled to the second storage capacitor via a second node to store the first data bit value.

At 530, the processing system may provide at least one noise protection device linking the first cell and the second cell, where the at least one noise protection device may be configured to dissipate at least a portion of noise originating in one of the first cell or the second cell to another of the first cell or the second cell. For instance, 530 may include design layout and physical placement for an IC design including the memory device or the memory cell that includes the at least one noise protection device. Alternatively, or in addition, 530 may include fabrication of the at least one noise protection device, e.g., on an IC wafer, die, or the like. For instance, 530 may include providing the wafer, deposition of metal, insulator, and/or semiconductor materials for forming components, traces, vias, etc., masking, patterning, and/or removal of materials via etch, CMP, or the like, doping, material growth, e.g., epitaxy, and so forth. In an example in which the first cell and the second cell comprise SRAM cells, the at least one noise protection device may be provided to link the first node of the first cell and the third node of the second cell (e.g., where the first cell and the second cell are to store the same first data bit value). In one example, the at least one noise protection device (e.g., at least a second noise protection device) may alternatively or additionally be provided to link the second node of the first cell and the fourth node of the second cell, e.g., where the first cell and the second cell are to store the same second data bit value that is complementary to the first data bit value. In an example in which the first cell and the second cell comprise DRAM cells, the at least one noise protection device may link the first node from the first cell and the second node from the second cell.

In one example, the at least one noise protection device may be provided to include at least one bidirectional threshold switching device (BTSD). For instance, 530 may include forming the at least one BTSD at least one asymmetric or symmetric metal-insulator-metal structure, such as an asymmetric structure of palladium/hafnium oxide/silver layers, or a symmetric structure of palladium/silver/hafnium oxide/sliver/palladium layers. In another example, the at least one noise protection device may be provided to include at least one resistor. In still another example, the at least one noise protection device may be provided to include at least one diode-connected transistor. In one example, the at least one noise protection device may be configured to dissipate the noise by reducing a voltage resulting from a charge build and/or induced by a current created by a transient pulse. For instance, this may include providing a current path that minimizes the voltage change at an initially affected cell, or node of a cell. Following 530, the method 500 may proceed to 595 where the method 500 ends.

It should be noted that method 500 may be expanded to include additional steps, or may be modified to replace steps with different steps, to combine steps, to omit steps, to perform steps in a different order, and so forth. In one example, the method 500 may be expanded or modified to include steps, functions, and/or operations, or other features described in connection with the example(s) of FIG. 1-4, 6, or 7, or as described elsewhere herein. Thus, these and other modifications are all contemplated within the scope of the present disclosure.

In addition, in one example, the present disclosure may include a memory device, e.g., an apparatus, having a first cell and a second cell, where the first cell and the second cell are each to store at least a first data bit value. In addition, the memory device may include at least one noise protection device linking the first cell and the second cell that is configured to dissipate at least a portion of noise originating in one of: the first cell or the second cell to another of: the first cell or the second cell. In one example, the noise may be a transient pulse, e.g., an unintended transient pulse. In one example, the transient pulse may be a single event transient. In one example, the dissipating of noise may include reducing a voltage resulting from a charge build up and/or induced by a current created by a transient pulse. For instance, this may include providing a current path that minimizes the voltage change at an initially affected cell, or node of a cell.

In one example, the memory device may be an SRAM device. Thus, for instance, the first cell may include a first node to store the first data bit value and a second node to store a second data bit value that is complementary to the first data bit value. In addition, in such an example, the second cell may include a third node to store the first data bit value and a fourth node to store the second data bit value. In an example in which the memory device is an SRAM memory device, the first cell may also include a first inverter and a second inverter, e.g., where the first inverter and the second inverter are cross-coupled in a first feedback loop that includes the first node and the second node. Similarly, the second cell may include a third inverter and a fourth inverter, where the third inverter and the fourth inverter are cross-coupled in a second feedback loop that includes the third node and the fourth node. In one example, the at least one noise protection device may include at least a first noise protection device linking the first node and the third node. In such an example, the at least the first noise protection device may be configured to dissipate at least a portion of noise originating in one of: the first node or the third node to another of: the first node or the third node. In one example, the at least one noise protection device may further include at least a second noise protection device linking the second node and the fourth node. In such an example, the at least the second noise protection device may be configured to dissipate at least a portion of noise originating in one of: the second node or the fourth node to another of: the second node or the fourth node.

In one example, the first inverter may include a first pull-up transistor and a first pull-down transistor. Similarly, the second inverter may include a second pull-up transistor and a second pull-down transistor. In one example, the first cell may include a first access transistor for the first node of the feedback loop and a second access transistor for the second node of the feedback loop, and similarly for the second cell. In one example, the first cell may also include a word line, where a first gate of the first access transistor and a second gate of the second access transistor may be controlled via the word line (and similarly for the second cell). In one example, the first cell may further include a first bitline and a second bitline, where the first access transistor may be coupled to the first bitline and the first node of the feedback loop, and where the second access transistor may be coupled to the second bitline and the second node of the feedback loop (and similarly for the second node). In one example, the first cell may additionally include a sense amplifier coupled to the first bitline and to the second bitline, where the sense amplifier is for a read operation. In one example, the second cell may further include a sense amplifier. Alternatively, or in addition, in one example, a sense amplifier may be included in the memory device and may be shared across multiple memory cells.

In another example, the memory device may be a DRAM device. For instance, the first cell may include a first storage capacitor and a first access transistor having a first gate coupled to an address bar, a first source coupled to a bit line, and a first drain coupled to the first storage capacitor via a first node to store the first data bit value. Likewise, the second cell may include a second storage capacitor and a second access transistor having a second gate coupled to the address bar, a second source coupled to the bit line, and a second drain coupled to the second storage capacitor via a second node to store the first data bit value. In such an example, the at least one noise protection device may link the first node and the second node.

In one example, the at least one noise protection device may include at least one bidirectional threshold switching device. In one example, the bidirectional threshold switching device(s) may each include a silver and oxide-based structure, e.g., hafnia, hafnium oxide, or hafnium oxide polymorphs (e.g., HfOx), where x varies depending on the polymorph (e.g., x=2, 0.7, 1.7, etc.). In another example, a different metal besides silver (Ag) may be utilized, such as copper (Cu), etc. Accordingly, in one example, the bidirectional threshold switching device(s) may include a metal and hafnium oxide-based structure. In one example, the bidirectional threshold switching device(s) may be configured with a positive threshold voltage to turn on, a positive hold voltage to turn off, a negative threshold voltage to turn on, and a negative hold voltage to turn off. For instance, "on" may be considered a current greater than 10-6 A, while "off" may be considered a current less than 10-10 A, or the like. In one example, the positive threshold voltage and the negative threshold voltage may be symmetric, and likewise for the positive hold voltage and the negative hold voltage. In one example, the positive threshold voltage may be greater than a transistor threshold voltage of a first pull-down transistor of the first inverter of an SRAM cell/sub-cell and/or of a transistor threshold voltage of a second pull-down transistor of the second inverter of the SRAM cell/sub-cell (which in one example may be the same transistor threshold voltage as that of the first pull-down transistor of the first inverter).

In another example, the at least one noise protection device may include at least one resistor, e.g., including one or more memristors. In still another example, the at least one noise protection device may include at least one diode-connected transistor. For instance, the at least one diode-connected transistor may be a metal-oxide-semiconductor field-effect transistor having a connected gate and drain (e.g., for NMOS, PMOS, or CMOS implementations, and/or for a junction field-effect transistor (JFET)) or a connected base and collector (e.g., for a bipolar junction transistor (BJT)). In an example in which the memory cell is an SRAM memory cell, the at least one diode-connected transistor may include at least a first n-type diode-connected transistor linking the first node and the third node. In one example, the at least one diode-connected transistor may further include at least a first p-type diode-connected transistor in parallel to the at least the first n-type diode connected transistor linking the first node and the third node, at least a second n-type diode-connected transistor linking the second node and the fourth node, and at least a second p-type diode-connected transistor in parallel to the at least the second n-type diode connected transistor linking the second node and the fourth node (e.g., an NPNP bridge, such as described above in connection with the example memory cell 350 of FIG. 3). In an example in which the memory cell is a DRAM memory cell, the at least one diode-connected transistor may include at least a first n-type diode-connected transistor having a drain coupled to the first node, and at least a second n-type diode-connected transistor having a drain coupled to the second node, e.g., the n-type transistors (e.g., NMOS) are configured to provide diode functionality in the opposite directions. Various other configurations for both SRAM and DRAM may be implemented as further described above, including 4N, 4P, and 8T diode-connected transistor bridges as noise protection device(s), multi-port SRAM memory cells, combinations of different noise protection device types, e.g., utilizing one or more resistors and one or more diode-connected transistors in parallel, utilizing both a BTSD and one or more diode-connected transistors in parallel, and so forth. In one example, the foregoing apparatus(es) may represent a memory device that may be designed and/or fabricated in association with the example method 500 of FIG. 5 and/or may be used in connection with any one or more aspects of the method 500.

Figure 6:
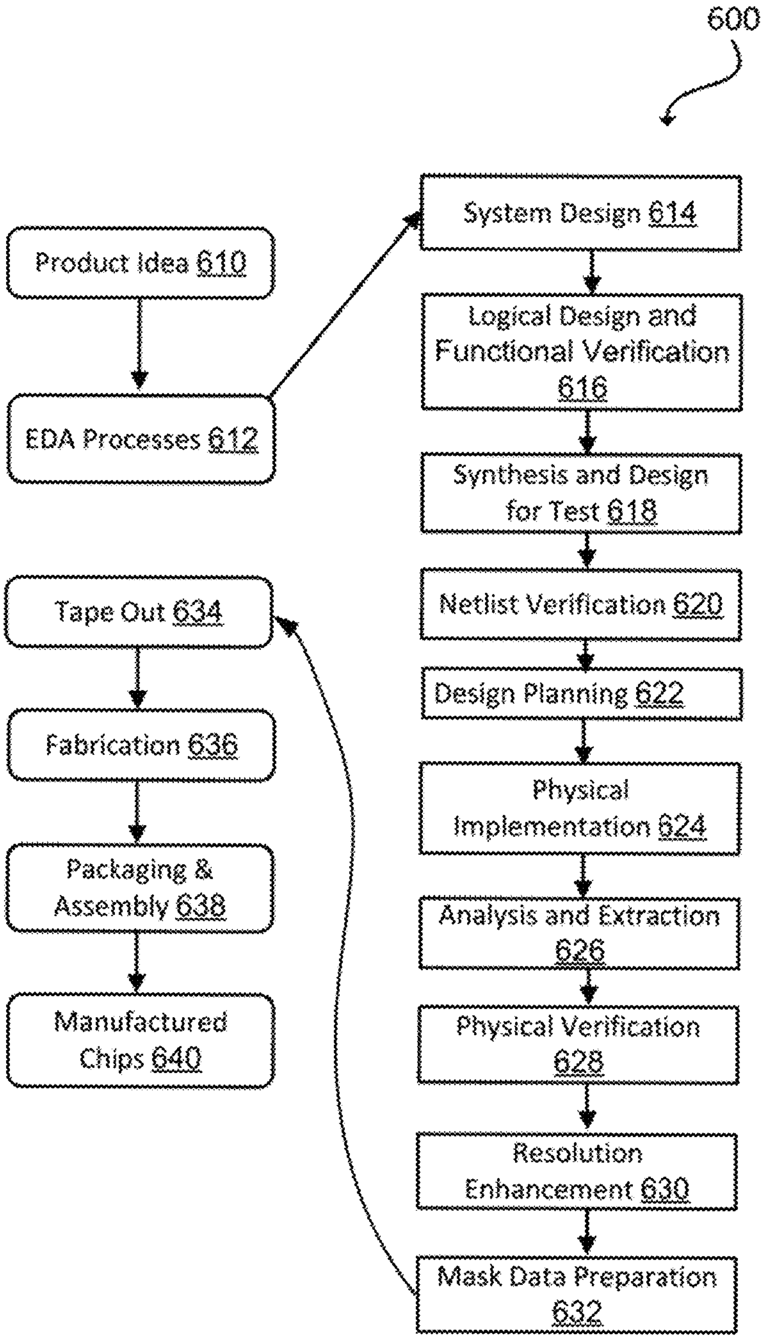
FIG. 6 illustrates a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower representation level that is a more detailed description adds more useful details into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 6. The described processes may be enabled by EDA products (or EDA systems).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
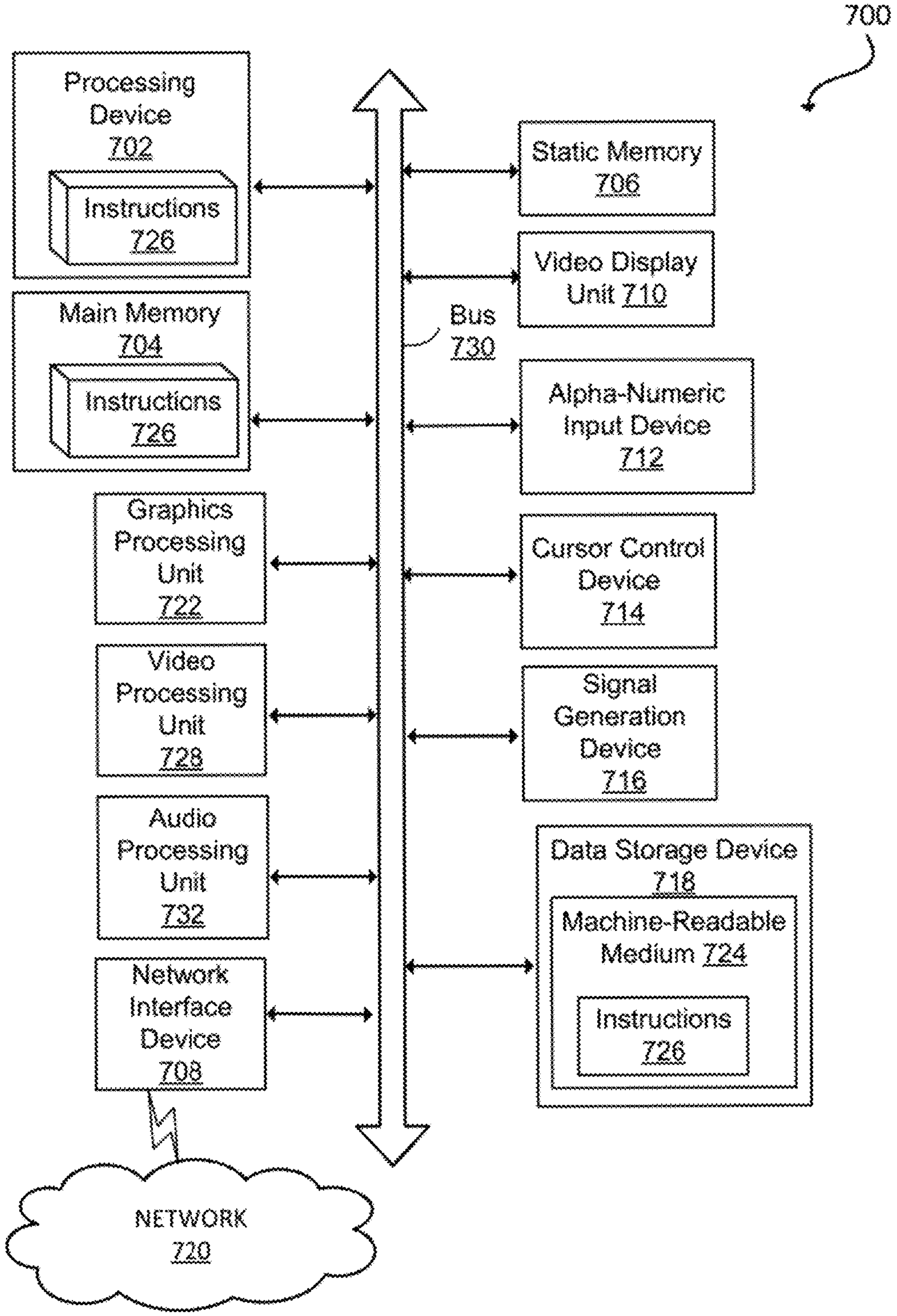
FIG. 7 illustrates a diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each connected to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The present disclosure and drawings are, accordingly, to be regarded in an illustrative sense rather than a restrictive sense.

What is claimed is:

1. A memory device comprising:

a first cell;

a second cell, wherein the first cell and the second cell are each to store at least a first data bit value; and at least one noise protection device linking the first cell and the second cell that is configured to dissipate at least a portion of noise originating in one of: the first cell or the second cell to another of: the first cell or the second cell, wherein the noise comprises a transient pulse.

2. The memory device of claim 1, wherein the memory device comprises a static random access memory device, wherein the first cell comprises a first node to store the first data bit value and a second node to store a second data bit value that is complementary to the first data bit value, and wherein the second cell comprises a third node to store the first data bit value and a fourth node to store the second data bit value.

3. The memory device of claim 2, wherein the first cell comprises:

a first inverter; and a second inverter, wherein the first inverter and the second inverter are cross-coupled in a first feedback loop that includes the first node and the second node; and wherein the second cell comprises:

a third inverter; and a fourth inverter, wherein the third inverter and the fourth inverter are cross-coupled in a second feedback loop that includes the third node and the fourth node.

4. The memory device of claim 2, wherein the at least one noise protection device comprises:

at least a first noise protection device linking the first node and the third node; and at least a second noise protection device linking the second node and the fourth node.

5. The memory device of claim 1, wherein the memory device comprises a dynamic random access memory device, wherein the first cell comprises a first storage capacitor and a first access transistor having a first gate coupled to an address bar, a first source coupled to a bit line, and a first drain coupled to the first storage capacitor via a first node to store the first data bit value, wherein the second cell comprises a second storage capacitor and a second access transistor having a second gate coupled to the address bar, a second source coupled to the bit line, and a second drain coupled to the second storage capacitor via a second node to store the first data bit value, and wherein the at least one noise protection device links the first node and the second node.

6. The memory device of claim 1, wherein the transient pulse comprises a single event transient.

7. A memory device comprising:

a first cell;

a second cell, wherein the first cell and the second cell are each to store at least a first data bit value; and at least one noise protection device linking the first cell and the second cell that is configured to dissipate at least a portion of noise originating in one of: the first cell or the second cell to another of: the first cell or the second cell, wherein the at least one noise protection device comprises at least one bidirectional threshold switching device.

8. The memory device of claim 7, wherein the at least one bidirectional threshold switching device comprises a silver and oxide-based structure.

9. The memory device of claim 7, wherein the at least one bidirectional threshold switching device comprises a metal and hafnium oxide-based structure.

10. The memory device of claim 7, wherein the at least one bidirectional threshold switching device is configured with a positive threshold voltage to turn on, a positive hold voltage to turn off, a negative threshold voltage to turn on, and a negative hold voltage to turn off.

11. The memory device of claim 10, wherein the positive threshold voltage and the negative threshold voltage are symmetric, and wherein the positive hold voltage and the negative hold voltage are symmetric.

12. The memory device of claim 7, wherein the memory device comprises a static random access memory device, wherein the first cell comprises a first node to store the first data bit value and a second node to store a second data bit value that is complementary to the first data bit value, and wherein the second cell comprises a third node to store the first data bit value and a fourth node to store the second data bit value.

13. The memory device of claim 12,
wherein the first cell comprises:
a first inverter; and
a second inverter, wherein the first inverter and the second inverter are cross-coupled in a first feedback loop that includes the first node and the second node; and
wherein the second cell comprises:
a third inverter; and
a fourth inverter, wherein the third inverter and the fourth inverter are cross-coupled in a second feedback loop that includes the third node and the fourth node.

14. The memory device of claim 12, wherein the at least one noise protection device comprises:
at least a first noise protection device linking the first node and the third node; and
at least a second noise protection device linking the second node and the fourth node.

15. The memory device of claim 7, wherein the memory device comprises a dynamic random access memory device, wherein the first cell comprises a first storage capacitor and a first access transistor having a first gate coupled to an address bar, a first source coupled to a bit line, and a first drain coupled to the first storage capacitor via a first node to store the first data bit value, wherein the second cell comprises a second storage capacitor and a second access transistor having a second gate coupled to the address bar, a second source coupled to the bit line, and a second drain coupled to the second storage capacitor via a second node to store the first data bit value, and wherein the at least one noise protection device links the first node and the second node.

16. A memory device comprising:
a first cell;
a second cell, wherein the first cell and the second cell are each to store at least a first data bit value; and
at least one noise protection device linking the first cell and the second cell that is configured to dissipate at least a portion of noise originating in one of: the first cell or the second cell to another of: the first cell or the second cell, wherein the at least one noise protection device comprises; at least one resistor or at least one diode-connected transistor.

17. The memory device of claim 16, wherein the at least one resistor comprises at least one memristor.

18. The memory device of claim 16, wherein the at least one diode-connected transistor comprises a metal-oxide-semiconductor field-effect transistor having a connected gate and drain.

19. The memory device of claim 16, wherein the at least one noise protection device comprises the at least one diode-connected transistor, wherein the memory device comprises a static random access memory device, wherein the first cell comprises a first node to store the first data bit value and a second node to store a second data bit value that is complementary to the first data bit value, wherein the second cell comprises a third node to store the first data bit value and a fourth node to store the second data bit value, and wherein the at least one diode-connected transistor comprises at least a first n-type diode-connected transistor linking the first node and the third node.

20. The memory device of claim 19, wherein the at least one diode-connected transistor further comprises at least a first p-type diode-connected transistor in parallel to the at least the first n-type diode connected transistor linking the first node and the third node, at least a second n-type diode-connected transistor linking the second node and the fourth node, and at least a second p-type diode-connected transistor in parallel to the at least the second n-type diode connected transistor linking the second node and the fourth node.

* * * * *